US010559674B2

(12) United States Patent
Hsu et al.

(10) Patent No.: US 10,559,674 B2
(45) Date of Patent: Feb. 11, 2020

(54) MANUFACTURING METHOD OF A TRENCH POWER SEMICONDUCTOR DEVICE

(71) Applicant: SUPER GROUP SEMICONDUCTOR CO., LTD., Hsinchu County (TW)

(72) Inventors: Hsiu-Wen Hsu, Hsinchu County (TW); Chun-Ying Yeh, Hsinchu (TW); Chun-Wei Ni, Hsinchu (TW); Yuan-Ming Lee, Taichung (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 1 day.

(21) Appl. No.: 15/988,018

(22) Filed: May 24, 2018

(65) Prior Publication Data
US 2019/0006489 A1 Jan. 3, 2019

(30) Foreign Application Priority Data

Jun. 30, 2017 (TW) .................................. 106122021

(51) Int. Cl.
H01L 29/66 (2006.01)
H01L 29/423 (2006.01)
H01L 29/40 (2006.01)
H01L 29/78 (2006.01)

(52) U.S. Cl.
CPC ...... H01L 29/66734 (2013.01); H01L 29/407 (2013.01); H01L 29/4236 (2013.01); H01L 29/7813 (2013.01)

(58) Field of Classification Search
None
See application file for complete search history.

(56) References Cited

U.S. PATENT DOCUMENTS

2012/0276703 A1* 11/2012 Grivna .................. H01L 29/407
438/270

* cited by examiner

Primary Examiner — Asok K Sarkar
(74) Attorney, Agent, or Firm — Li & Cai Intellectual Property (USA) Office

(57) ABSTRACT

A manufacturing method of a trench power semiconductor device is provided. The manufacturing method includes the steps of forming a protective layer on an epitaxial layer and forming a trench gate structure in a trench formed in an epitaxial layer. The trench gate structure includes a shielding electrode, a gate disposed on the shielding electrode and an inter-electrode dielectric layer disposed therebetween. The step of forming the trench gate structure includes forming an insulating layer covering an inner surface of the trench; and before the step of forming the inter-electrode dielectric layer, forming an initial spacing layer, the spacing layer including a first sidewall portion and a second sidewall portion, both of which include bottom end portions spaced apart from each other and extending portions protruding from the protective layer.

14 Claims, 11 Drawing Sheets

MANUFACTURING METHOD OF A TRENCH POWER SEMICONDUCTOR DEVICE

BACKGROUND OF THE INVENTION

1. Field of the Invention

The present disclosure relates to a manufacturing method of a trench power semiconductor device; more particularly, to a manufacturing method of a trench power semiconductor device with shielding electrodes.

2. Description of Related Art

The work losses of current power metal oxide semiconductor field transistors (power MOSFETs) can be classified into two main categories: switching loss and conducting loss. The gate/drain capacitance (Cgd) is an important parameter that can severely affect the switching loss. If the Cgd is too high, it will result in an increase in the switching loss, which in turn limits the switching speed of the power MOSFETs so that it may be harmful for the power MOSFETs to be used in high frequency circuits.

Current power MOSFETs have a shielding electrode located at the lower portion of the gate trench for reducing the Cgd and increasing the avalanche voltage (without sacrificing the on-resistance).

SUMMARY OF THE INVENTION

A manufacturing method of a trench power semiconductor device is provided in the present disclosure, in which a protective layer and a spacing layer are formed on a surface of an epitaxial layer and a sidewall of a trench. According to such disclosure, the surface of the epitaxial layer and the sidewall of the trench will not be oxidized during the thermal oxidation process.

The manufacturing method of a trench power semiconductor device according to an embodiment of the present disclosure includes forming an epitaxial layer on a substrate, forming a protective layer on a surface of the epitaxial layer, forming a trench in the epitaxial layer; and forming a trench gate structure in the trench, in which the trench gate structure includes a shielding electrode, a gate disposed on the shielding electrode and an inter-electrode dielectric layer disposed between the shielding electrode and the gate. The step of forming the trench gate structure at least includes forming an insulating layer covering an inner surface of the trench, and before the step of forming the inter-electrode dielectric layer, forming an initial spacing layer, wherein the spacing layer includes a first sidewall portion and a second sidewall portion respectively covering the two inner surfaces of the insulating layer, the bottom end portion of the first sidewall portion is separate from the bottom end portion of the second sidewall portion, and both of the first and second sidewall portions have an extending portion protruding from the protective layer.

In sum, in the manufacturing method of a trench power semiconductor device according to the embodiment of the present disclosure, the protective layer is formed on the epitaxial layer and the spacing layer is formed on the sidewall of the trench before forming the interlayer dielectric layer by the thermal oxidation process, so as to protect the surface of the epitaxial layer and the sidewall of the trench from further oxidization.

Moreover, the first sidewall portion of the spacing layer is separate from the bottom of the second sidewall portion. When a reverse bias is applied to the trench power semiconductor device, since the materials filled into the bottom of the trench and right under the shielding electrode are more pure, the electric field distribution at the bottom of the trench can be alleviated. That is, the avalanche voltage of the devices can be increased without sacrificing the on-resistance.

In order to further the understanding of the present disclosure, the following embodiments are provided along with illustrations to facilitate the disclosure of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure will be illustrated in the following description and appended drawings.

Figure 1:
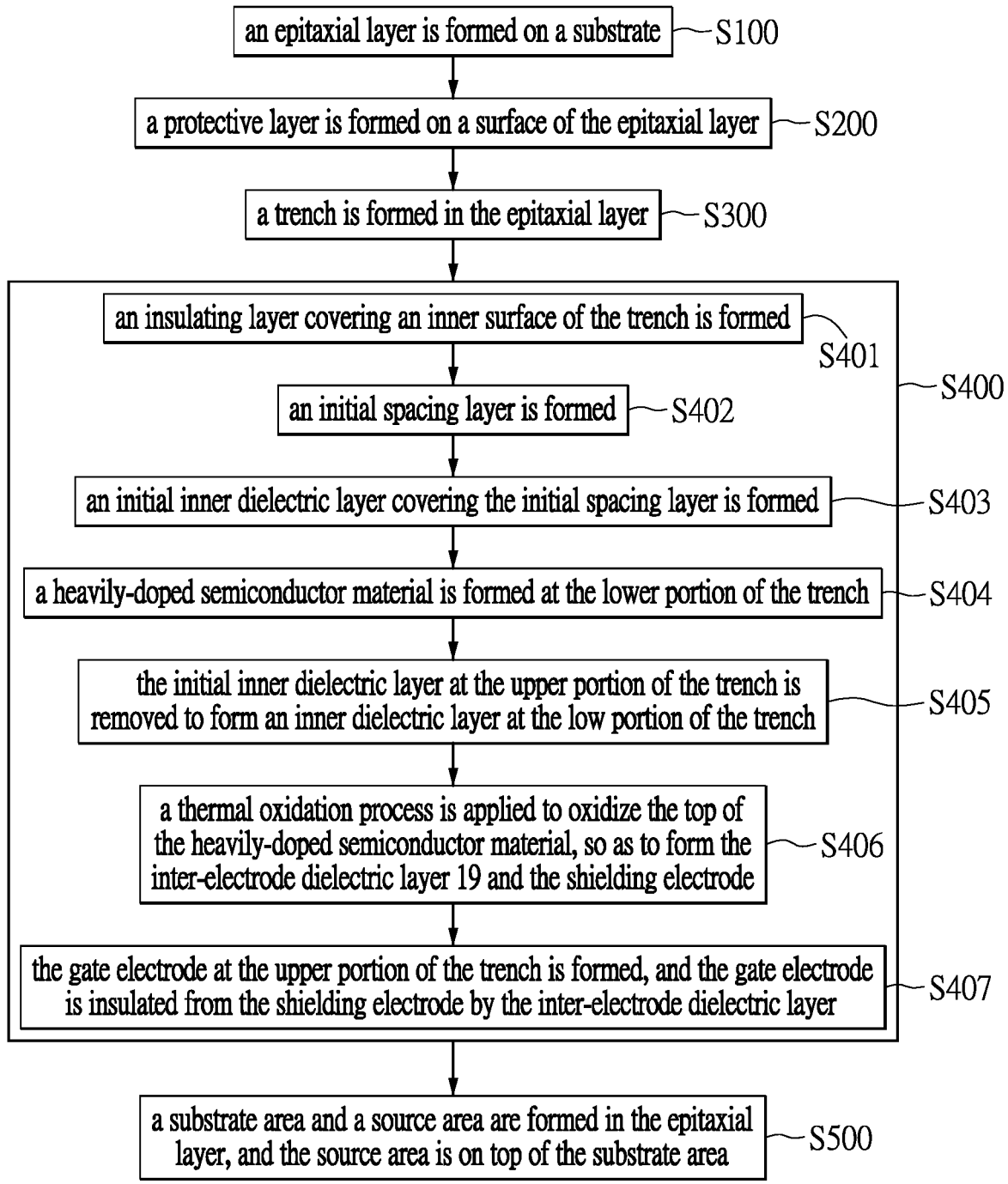
FIG. 1 is a flowchart illustrating a manufacturing method of a trench power semiconductor device according to an embodiment of the present disclosure.
Figure 2A:
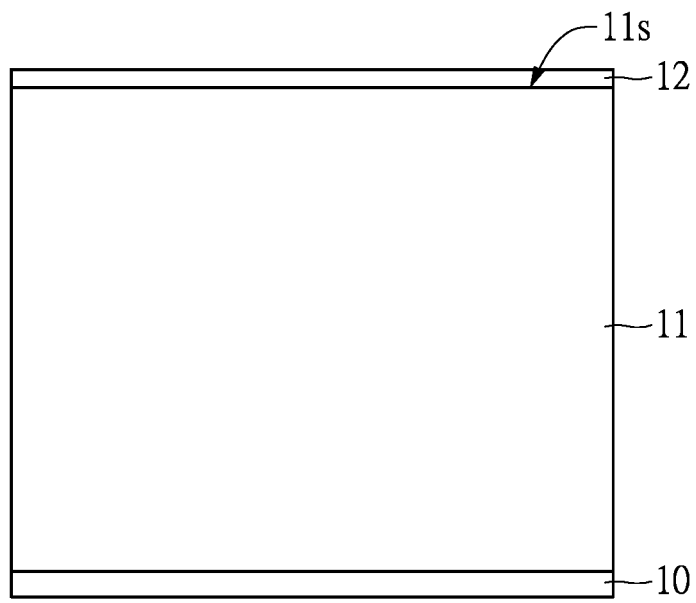
FIGS. 2A-2O are respectively partial sectional views illustrating the trench power semiconductor device at each step of the manufacturing method according to an embodiment of the present disclosure.
Figure 2B:
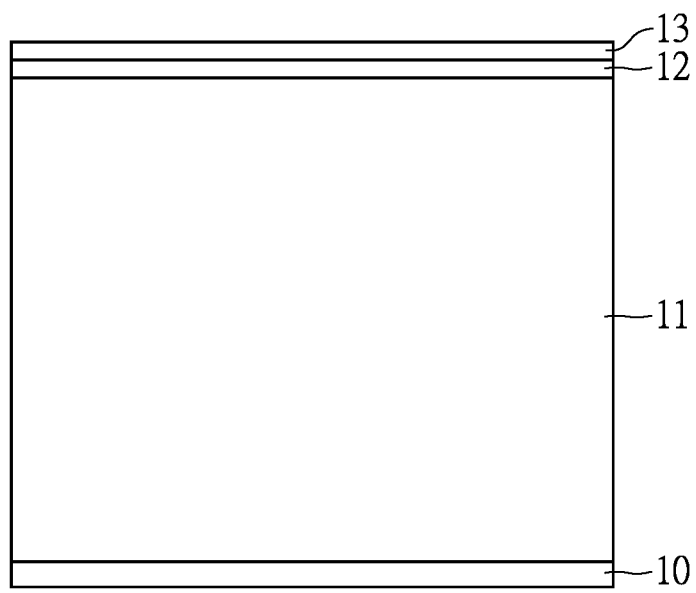

Reference is made to FIG. 1, where FIG. 1 is a flowchart illustrating a manufacturing method of a trench power semiconductor device according to an embodiment of the present disclosure. Reference is also made to FIGS. 2A-2O, where FIGS. 2A-2O respectively are partial sectional views illustrating trench power semiconductor device at each step of the manufacturing method according to an embodiment of the present disclosure.

As shown in FIG. 1, in step S100, an epitaxial layer is formed on a substrate and, and in step S200, a protective layer is formed on a surface of the epitaxial layer. FIGS. 2A-2B are referred to collectively in the following description.

As shown in FIG. 2A, the epitaxial layer 11 is formed on the substrate 10, and the epitaxial layer 11 has a surface 11s away from the substrate 10.

The substrate 10 is heavily doped with first type conductive dopants to serve as a drain of the trench power semiconductor device. The first type conductive dopants can be N-type or P-type conductive dopants. Assuming that the substrate 10 is a silicon substrate, the N-type conductive dopants are pentavalent element ions such as phosphorous ions or arsenic ions, and the P-type conductive dopants are trivalent element ions such as boron ions, aluminum ions or gallium ions.

The epitaxial layer 11 is of the same conductive type as the substrate 10 but is with less doping concentration than the substrate 10. For example, in an NMOS transistor, the substrate 10 has a high concentration of N-type dopant ($N^+$ doping), but the epitaxial layer 11 has a low concentration of N-type dopant ($N^-$ doping). For another example, a PMOS transistor, the substrate 10 has high concentration of P-type dopant ($P^+$ doping) but the epitaxial layer 11 has low concentration of P-type dopant ($P^-$ doping).

Moreover, in the present embodiment, after the step of forming the epitaxial layer 11 on the substrate 10, a pad oxide 12 is formed on the surface 11s of the epitaxial layer 11. The pad oxide 12 can serve as an etching stopping layer in the subsequent manufacturing process.

As shown in FIG. 2B, a protective layer 13 is formed on the pad oxide 12. The material of the protective layer 13 is different from the pad oxide 12. The material for the protective layer 13 can be nitride oxide, such as silicon nitride, which is capable of protecting the surface 11s of the protective layer from oxidation in the following thermal oxidation process.

Figure 2C:
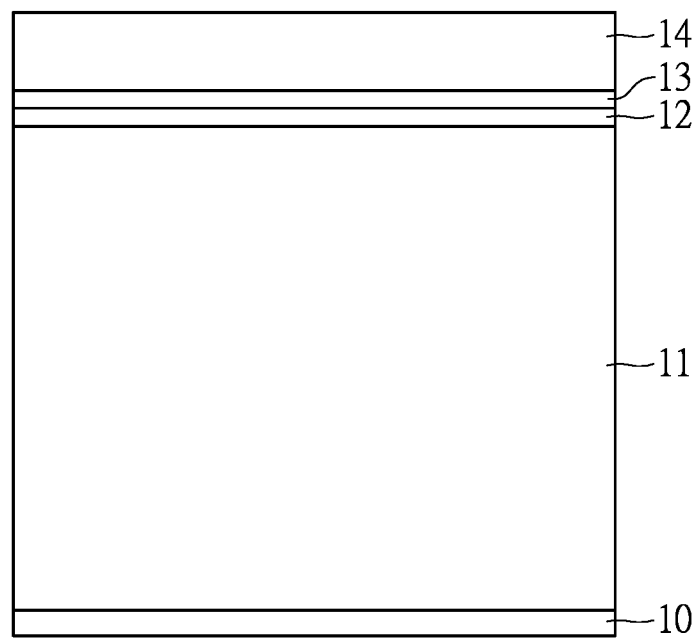

Reference is next made to FIG. 2C, after the forming of the protective layer 13, the manufacturing method of the trench power semiconductor device of the present embodiment further includes forming a hard film layer 14 on the protective layer 13.

Figure 2D:
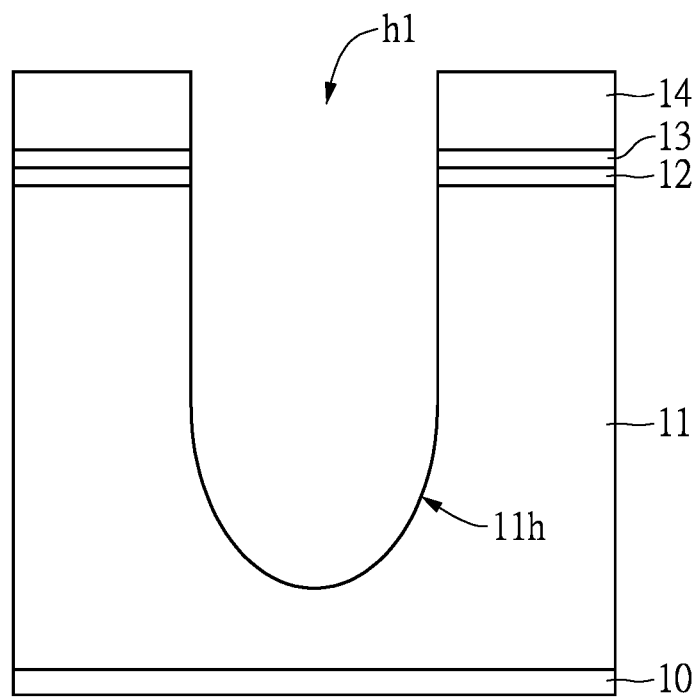
Figure 2E:
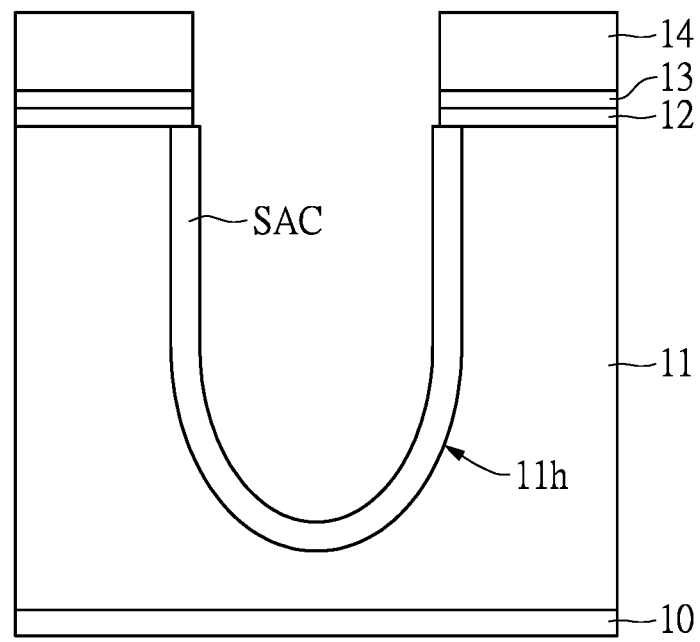

Referring back to FIG. 1, in step S300, a trench is formed in the epitaxial layer. As shown in FIG. 2D, a trench 11h is formed in the epitaxial layer 11. Moreover, in the step of forming the trench 11h in the epitaxial layer 11, an opening hl in spatial connection with the trench 11h is also formed in the hard film layer 14 and the protective layer 13.

The step of forming the trench 11h and the opening hl can be implemented by known techniques. For example, a pattern photoresist (not shown in the figure) is firstly formed on the hard film layer 14 so that a position of the opening hl can be defined. After that, the opening hl is formed through the pattern photoresist, and then the trench 11h is further formed in the epitaxial layer 11. Furthermore, the trench 11h can be formed in the epitaxial layer 11 by an etching process such as dry etching or wet etching.

When forming the trench 11h, due to a crystallographic defect on the inner sidewall of the trench 11h, a sacrificial oxide layer SAC should first be formed on the inner sidewall of the trench 11h and then removed, which allows the inner sidewall of the trench 11h to be repaired. The crystallographic defect on the inner sidewall can thereby be reduced to prevent electrical leakage.

Figure 2F:
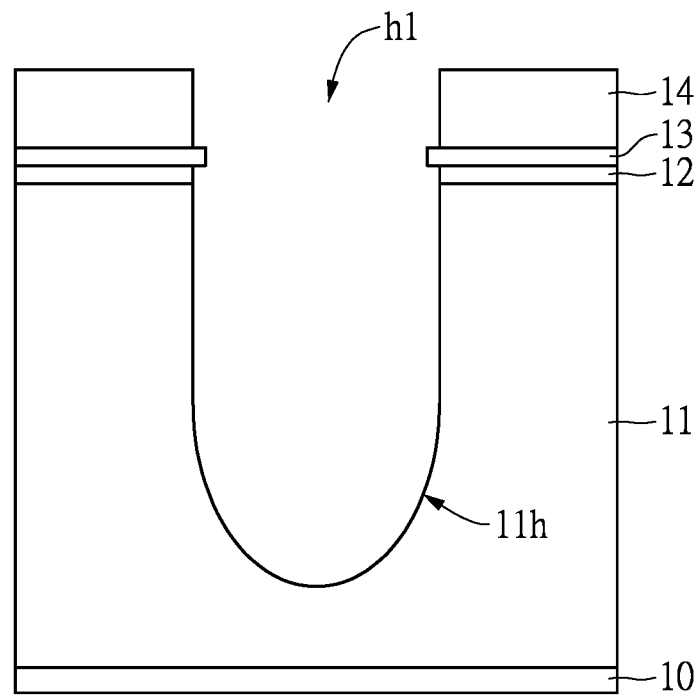

It should be noted that, before forming the trench 11h, the surface of the epitaxial layer 11 has the protective layer 13 and the hard film layer 14. Therefore, the surface 11s of the epitaxial can be protected from oxidation during the forming of the sacrificial oxide layer SAC through the thermal oxidation process. Next, referring to FIG. 2F, the sacrificial oxide layer SAC is then removed.

Reference is made to FIG. 1. In step S400, a trench gate structure is formed in the trench. In the present embodiment, the step of forming the gate structure further includes steps S401 to S407.

Figure 2G:
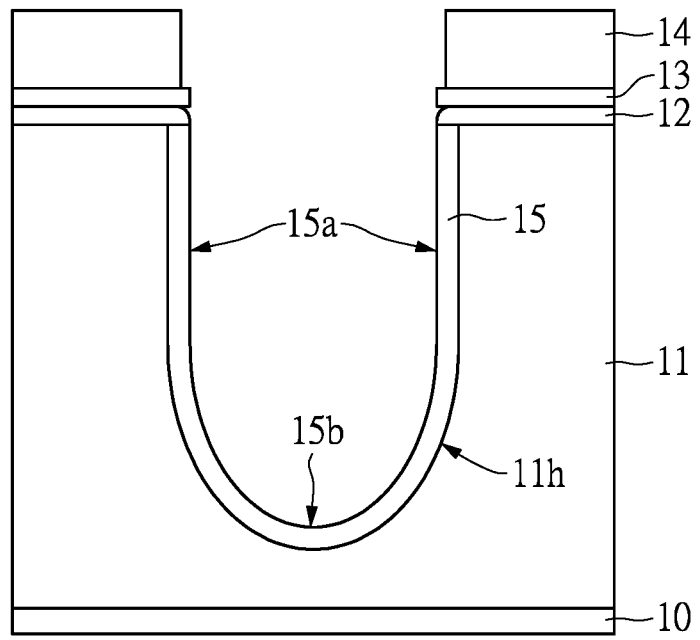

To be more specific, in step S401, an insulating layer covering an inner surface of the trench is formed. As shown in FIG. 2G, the insulating layer 15 covers the inner surface of the trench 11h, and has an outline substantially the same as the inner surface of the trench 11h. As shown in FIG. 2G, the insulating layer 15 has two opposite inner sidewalls 15a and a bottom end portion 15b connecting with the two inner sidewalls 15a. The insulating layer 15 can be an oxide layer formed by the thermal oxidation process, such as silicon oxide.

Reference is collectively made to FIG. 1. In step S402, an initial spacing layer is formed. A more detailed description will be provided in FIGS. 2H-2I.

Figure 2H:
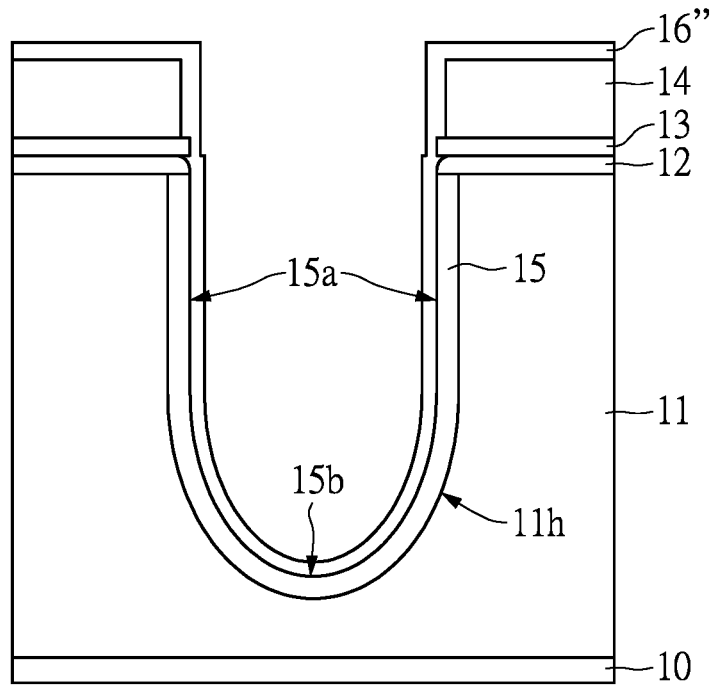

As shown in FIG. 2H, a spacing dielectric layer 16" is formed. The spacing dielectric layer 16" covers the surface of the hard film layer 14, the inner surface of the opening hl, the two sidewalls 15a and the bottom end portion 15b of the insulating layer 15, in a carpet-like manner. Furthermore, in the present embodiment, the material of the spacing dielectric layer 16" can be the same as the material of the protective layer 13, such as nitride. However, the material of the spacing dielectric layer 16" is different from that of the insulation layer 15. In the present embodiment, the thickness of the spacing dielectric layer 16" is kept substantially the same, that is to say, the thickness is not decreased with the increase of the depth of the trench 11h.

Figure 2I:
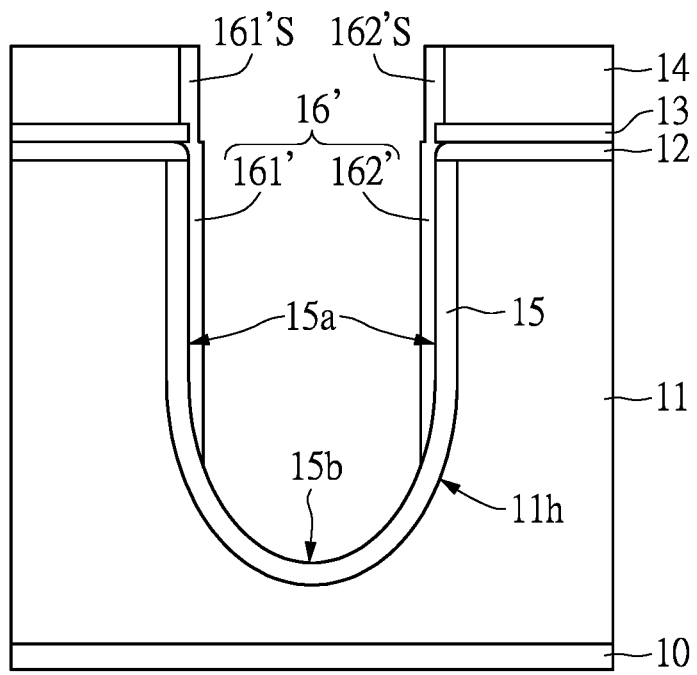

Reference is next made to FIG. 2I. The bottom end portion 15b of the insulation layer 15 and the spacing dielectric layer 16" covering the hard film layer 14 are removed to form the initial spacing layer 16'. In one embodiment, dry etching is used to remove the bottom end portion 15b of the insulation layer 15 and the spacing dielectric layer 16" covering the hard film layer 14, leaving the spacing dielectric layer on the two inner sidewalls 15a of the insulation layer 15 (i.e., the initial spacing layer 16').

In other words, the initial spacing layer 16' has a first sidewall portion 161' and a second sidewall portion 162' respectively covering the two inner sidewalls 15a. Moreover, the bottom of the first sidewall portion 161' is separate from the bottom of the second sidewall portion 162', so as to be exposed from the bottom end portion 15b of the insulating layer 15. Furthermore, the first sidewall portion 161' and the second sidewall portion 162' both have a extending portion 161'S, 162'S protruding from the protective layer 13, and the extending portions 161'S, 162'S cover the inner surface of the opening hl.

Reference is made to FIG. 1. In step S403, an initial inner dielectric layer covering the initial spacing layer is formed, in which the bottom of the initial inner dielectric layer is directly in contact with the bottom end portion of the insulating layer 15.

Figure 2J:
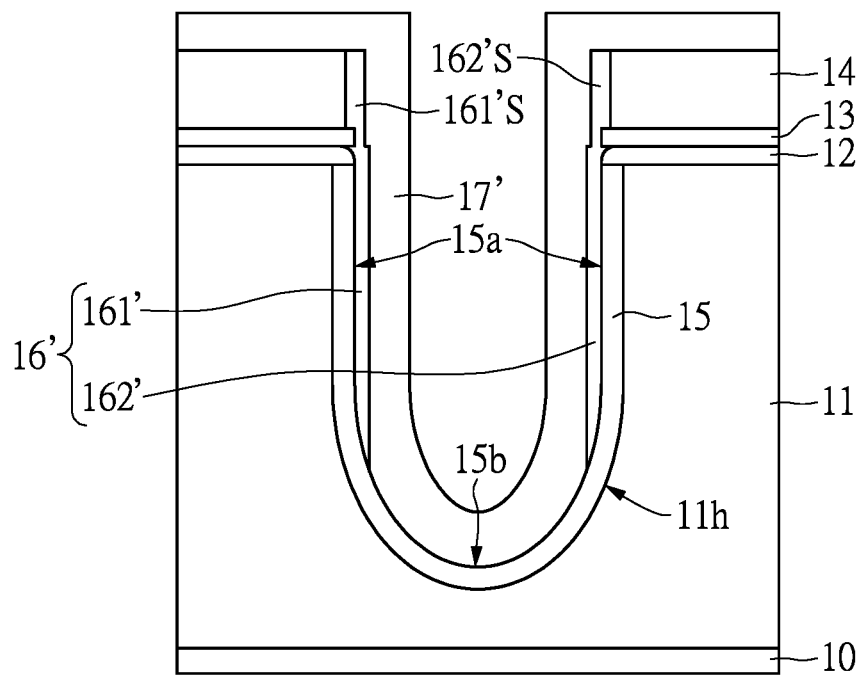

Reference is collectively made to FIG. 2J. The initial inner dielectric layer 17' covers on the surface 11s of the epitaxial layer 11 and in the trench 11h. Moreover, the bottom of the initial inner dielectric layer 17' is directly in contact with the bottom end portion 15b of the insulating layer 15. In the present embodiment, the material of the initial inner dielectric layer 17' is different from that of the initial spacing layer 16', but is the same as that of the insulating layer 15. In one embodiment, the insulating layer 15 and the initial inner dielectric layer 17' are both silicon oxide layers, and the initial spacing layer 16' is a silicon nitride layer.

That is, the materials filled into the bottom of the trench 11h is more pure, so that the electric field distribution at the bottom of the trench can be alleviated, and that the avalanche voltage of the devices can be increased without sacrificing the on-resistance.

Figure 2K:
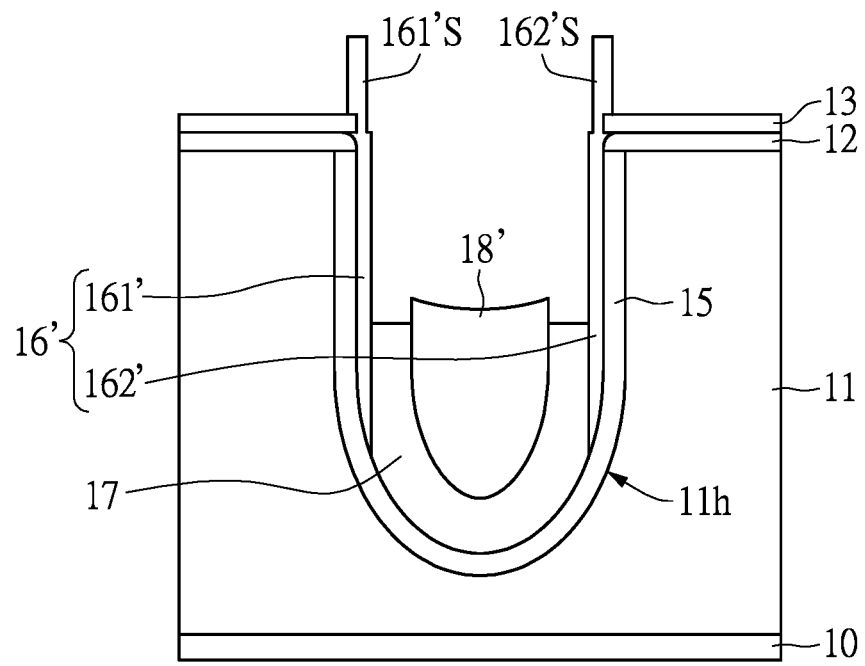

Reference is made to FIG. 1. In step S404, a heavily-doped semiconductor material is formed at the lower portion of the trench. In step S405, the initial inner dielectric layer at the upper portion of the trench is removed to form an inner dielectric layer at the low portion of the trench. As shown in FIG. 2K, the heavily-doped semiconductor material 18' is filled into the lower portion of the trench 11h.

In one embodiment, a heavily-doped semiconductor layer is formed on the epitaxial layer 11, and then filled in the trench 11h. After that, the heavily-doped semiconductor layer covering the epitaxial layer 11 is etched back, leaving the heavily-doped semiconductor material 18' at the lower portion of the trench 12. The heavily-doped semiconductor material 18' can be such as doped poly-Si.

After removing the initial inner dielectric layer 17' at the upper portion of the trench 11h, the top of the heavily-doped semiconductor material 18' protrudes out of the top of the inner dielectric layer 17. Moreover, after removing the initial inner dielectric layer 17' at the upper portion of the trench 11h, the hard film layer 14 on the protective layer 13 is also removed.

Reference is made to FIG. 1. In step S406, a thermal oxidation process is applied to oxidize the top of the heavily-doped semiconductor material, so as to form the inter-electrode dielectric layer 19 and the shielding electrode 18.

Figure 2L:
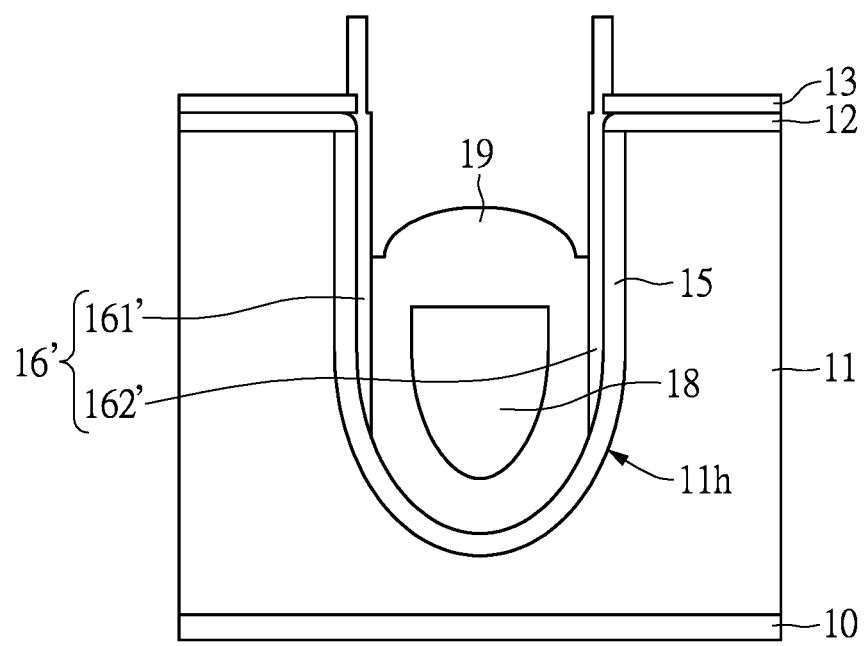

As shown in FIG. 2L, after applying the thermal oxidation process, the top of the heavily-doped semiconductor material 18' is oxidized, forming the inter-electrode dielectric layer 19. The portion of the heavily-doped semiconductor material 18' not being oxidized forms the shielding electrode 18. It should be noted that due to the protection of the initial spacing layer 16' and the protective layer 13, the epitaxial layer 11 is not oxidized during the thermal oxidation process.

Reference is again made to FIG. 1, in step S407, the gate electrode at the upper portion of the trench is formed. The gate electrode is insulated from the shielding electrode by the inter-electrode dielectric layer.

Figure 2M:
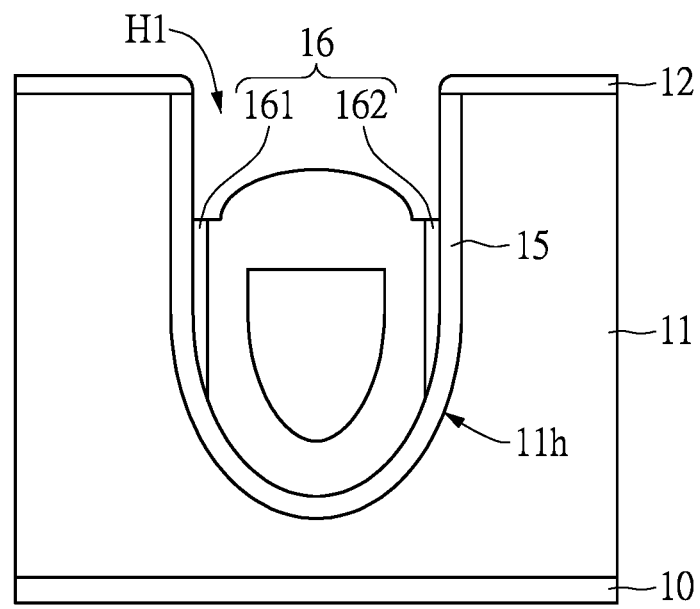
Figure 2N:
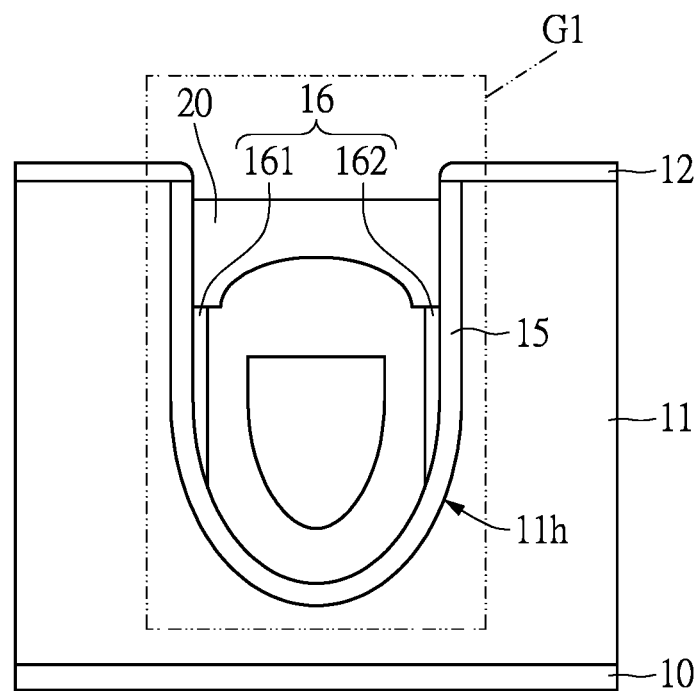
Figure 2O:
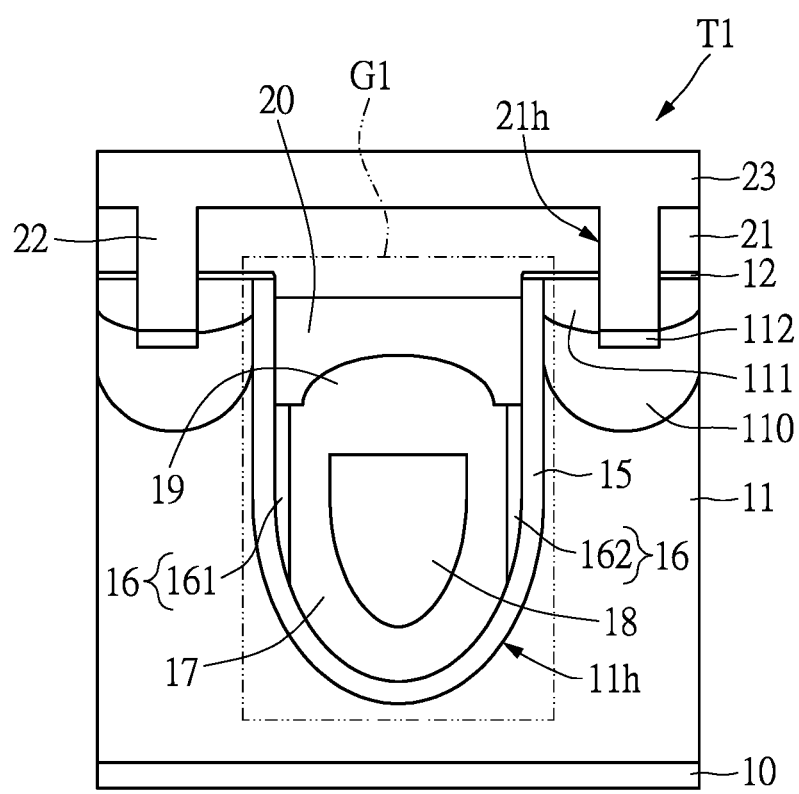

Reference is made to FIGS. 2M to 2N. As shown in FIG. 2M, in one of the embodiments of the present disclosure, before forming the gate electrode 20, the extending portions 161'S, 162'S and the initial spacing layer 16' at the upper portion of the trench 11h will be firstly removed to form a spacing layer 16. The protective layer 13 will also be removed in this step. The spacing layer 16 is located below the gate electrode 20, and includes a first spacing portion 161 and a second spacing portion 162 respectively at the two opposite sides of the shielding electrode 18.

In FIG. 2M, the insulating layer 15, the inter-electrode dielectric layer 19 and the spacing layer 16 define an accommodation space H1 on the upper portion of the trench 11h. After that, with reference made to FIG. 2N, the gate electrode 20 is formed in the accommodation space H1 on the upper portion of the trench 11h.

In the step of forming the gate electrode 20, doped poly-Si can be firstly formed and carpeted on the epitaxial layer 11 and filled in the accommodation space H1, and the doped poly-Si on the epitaxial layer 11 can then be etched back to form the gate electrode 20. By the steps from S401 to S407, the trench gate structure G1 can be formed in the trench 11h.

Reference is made to FIG. 1. In step S500, a substrate area and a source area are formed in the epitaxial layer. The source area is on top of the substrate area. In the present embodiment, after the forming of the substrate area and the source area, a step of forming a wire redistribution layer on the surface of the epitaxial layer is further included. Reference is collectively made to FIG. 2O, in which the sectional view of the trench power semiconductor device according to the embodiment of the present disclosure is illustrated.

To be more specific, a substrate doping process is performed on the epitaxial layer 11 to form a low doping area, and the low doping area has an opposite conductive type to the epitaxial layer 11. After that, a source doping manufacturing is performed on the light doping area to form a high doping area at the upper portion of the light doping area, and the conductive type of the high doping area is opposite to that of the low doping area. A drive-in manufacturing is next performed to allow the diffusion of the dopants in the low and high doping areas to form the substrate area 110 and the source area 111. The source area 111 is on top of the substrate area 110.

After that, the wire redistribution layer can then be formed on the epitaxial layer 11, so as to allow the source area 111, the gate electrode 20 and the shielding electrode 18 to be electrically connected with an external control circuit. The forming of the wire redistribution layer can be implemented by known techniques.

To be more specific, an interlayer dielectric layer 21 is formed on the epitaxial layer 11 first. After that, a plurality of contact windows 21h penetrating the interlayer dielectric layer 21 are then formed, and the plurality of contact windows 21h extend to the source area 111.

A doping process is performed through the contact windows 21h to form a heavily-doped contact area 112 under the contact windows 21h. After that, a conductive pillar 22 is formed in the contact window 21h, and a source metal layer 23 connecting with the conductive pillar 22 is formed on the interlayer dielectric layer 21. That is to say, the source metal layer 23 can, through the conductive pillar 22, electrically connect with the source area 111.

The trench gate structure G1 of the trench power semiconductor device T1 manufactured by the above process includes the insulating layer 15, the spacing layer 16, the inner dielectric layer 17, the shielding electrode 18, the inter-electrode dielectric layer 19 and the gate electrode 20.

The material of the spacing layer 16 is different from that of the insulating layer 15 and the inner dielectric layer 17. The spacing layer 16 includes the first spacing portion 161 and the second spacing portion 162. The bottom of the first spacing portion 161 is spaced apart from the bottom of the second spacing portion 162 at a predetermined distance, and the predetermined distance is greater than the width of the shielding electrode 18.

Moreover, in the present embodiment, the first and the second spacing portions 161, 162 are at the lower portion of the trench 11h, and is interveningly disposed between the insulating layer 15, the inter-electrode dielectric layer 19 and the inner dielectric layer 17. That is to say, the first spacing portion 161 and the second spacing portion 162 do not serve as the gate insulating layer.

Figure 3A:
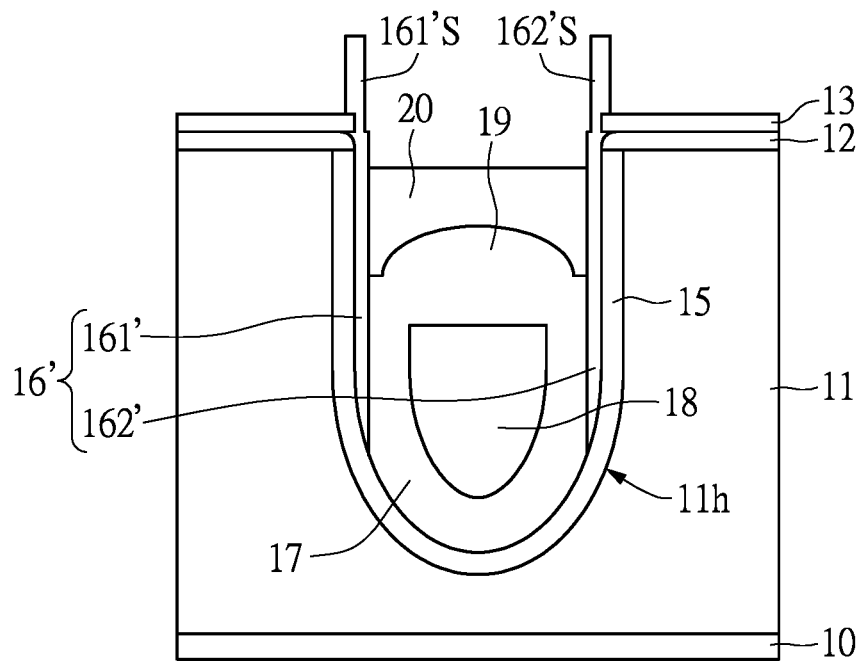
FIGS. 3A-3C are respectively partial sectional views illustrating the trench power semiconductor device at each step of the manufacturing method according to another embodiment of the present disclosure.
Figure 3B:
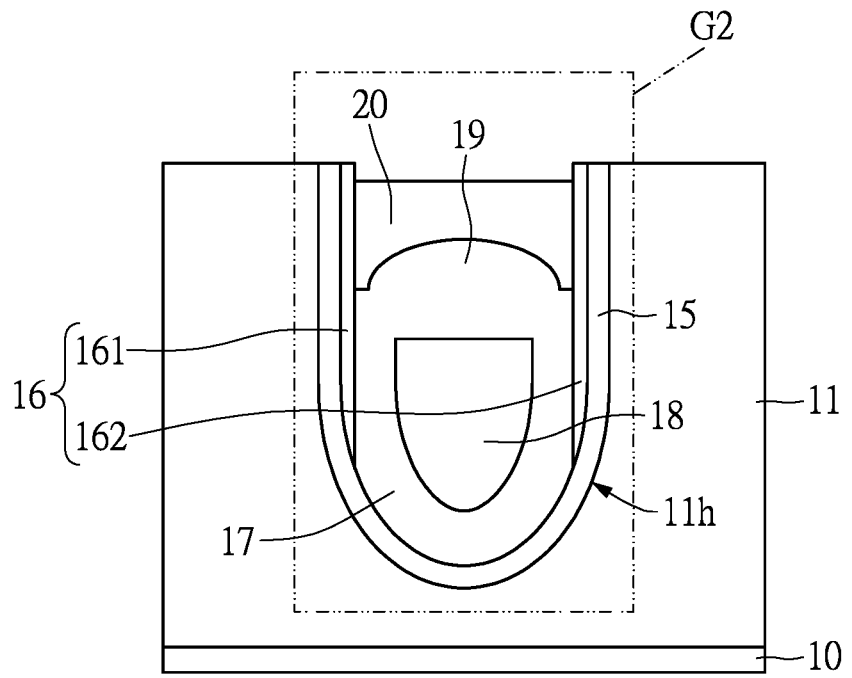
Figure 3C:
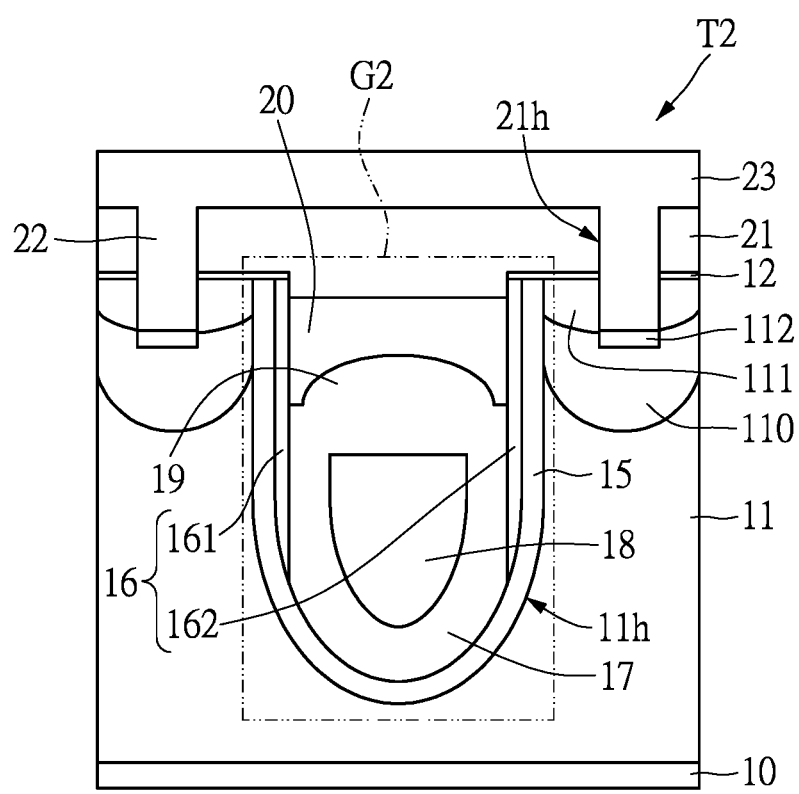

Reference is next made to FIGS. 3A-3C, where 3A-3C are respectively partial sectional views illustrating trench power semiconductor device at each step of the manufacturing method according to another embodiment of the present disclosure. The first spacing portion 161 and the second spacing portion 162 of the trench power semiconductor device T2 manufactured by the present embodiment cooperate with the insulating layer 15 to serve as the gate insulating layer.

In another embodiment for the manufacturing method of trench power semiconductor device, the steps in FIGS. 3A-3C are performed after the steps in FIGS. 2A-2L.

Referring to FIG. 3A, different from directly removing the extending portions 161'S, 162'S at the upper portion of the trench 11h shown in FIG. 2M, the gate electrode 20 of FIG. 3A is formed in the upper portion of the trench 11h without removing the extending portions 161'S, 162'S, the protective layer 13 and the initial spacing layer 16' at the upper portion of the trench 11h.

Referring to FIG. 3B, the protective layer 13 and the extending portions 161'S, 162'S on the epitaxial layer 11 is then removed to form the spacing layer 16. The protective layer 13 and the extending portions 161'S, 162'S can be removed by chemical mechanical polishing or selective etching.

The differences between the trench gate structure G2 of the present embodiment and the trench gate structure G1 in FIG. 2N are that, in the present embodiment, the first spacing portion 161 and the second spacing portion 162 both extend from the upper portion of the trench 11h to the lower portion of the trench 11h. Moreover, the first spacing portion 161 and the second spacing portion 162 cooperate with the insulating layer 15 to serve as the gate insulating layer to adjust the work function between the substrate area 110 and the gate electrode 20, so as to decrease the leakage current when operating under reverse bias.

Lastly, the substrate area 110, the source area 111 and the wire redistribution layer are then formed, as shown by the trench power semiconductor device T2 in FIG. 3C.

In sum, according to the manufacturing method of the trench power semiconductor device provided in the embodiments of the present disclosure, the spacing layer 16 is formed on the surface 11s of the epitaxial layer 11 and the sidewall of the trench 11h before the forming of the inter-electrode dielectric layer 19 by thermal oxidation process, so as to protect the surface 11s of the epitaxial layer 11 and the sidewall of the trench 11h from oxidation.

Furthermore, the bottom of the first spacing portion 161 is separate from the bottom of the second spacing portion 162, that is, when a reverse bias is applied to the trench power semiconductor device, since the materials filled into the bottom of the trench 11h and right under the shielding electrode 18 are more pure, the electric field distribution at the bottom of the trench 11h can be alleviated. That is, the avalanche voltage of the devices can be increased without sacrificing the on-resistance.

Under the situation that the avalanche voltage is increased, the doping concentration of the epitaxial layer 11 can further be optimized to reduce the on-resistance, so as to increase the voltage conversion efficiency of the trench power semiconductor device. Through simulation tests, it is proven that the bottom of the trench 11h of the trench power semiconductor device exhibits a gentle electric field, which increases the avalanche voltage. Therefore, the trench power semiconductor device according to the embodiments of the present disclosure exhibits a 50% decrease for the on-resistance.

Moreover, in the trench power semiconductor device T2 according to the embodiment of the present disclosure, by utilizing two different materials for the insulating layer 15 and the spacing layer 16, the work function between the substrate area 110 and the gate electrode 20 can be adjusted, so as to decrease the leakage current when the trench power semiconductor device T2 is operated under reverse bias.

The manufacturing method of the trench power semiconductor device according to the embodiments of the present disclosure can be integrated into current semiconductor manufacturing processes to provide the trench power semiconductor device of the present disclosure.

The description illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A manufacturing method of a trench power semiconductor device, comprising:
    forming an epitaxial layer on a substrate;
    forming a protective layer on a surface of the epitaxial layer;
    forming a trench in the epitaxial layer; and
    forming a trench gate structure in the trench, wherein the trench gate structure includes a shielding electrode, a gate disposed on the shielding electrode and an inter-electrode dielectric layer disposed between the shielding electrode and the gate, and the step of forming the trench gate structure at least includes:
        forming an insulating layer covering an inner surface of the trench; and
        before the step of forming the inter-electrode dielectric layer, forming an initial spacing layer, wherein the initial spacing layer includes a first sidewall portion and a second sidewall portion respectively covering the two inner surfaces of the insulating layer, the bottom end portion of the first sidewall portion is separate from the bottom end portion of the second sidewall portion, and both of the first and second sidewall portions have an extending portion protruding from the protective layer; and
        forming an inner dielectric layer and the shielding electrode at the lower portion of the trench, wherein the inner dielectric layer covers a lower portion of the initial spacing layer and surrounds the shielding electrode, and the inner dielectric layer is directly in contract with the bottom of the insulating layer.

2. The manufacturing method of a trench power semiconductor device according to claim 1, wherein the step of forming the inner dielectric layer and the shielding electrode includes:
    after the step of forming the initial spacing layer, forming an initial inner dielectric layer covering the initial spacing layer, wherein the bottom of the initial inner dielectric layer is directly in contact with the bottom of the insulating layer;
    forming a heavily-doped semiconductor material at the lower portion of the trench;
    removing the initial inner dielectric layer at the upper portion of the trench to form the inner dielectric layer at the low portion of the trench, wherein the inner dielectric layer surrounds the heavily-doped semiconductor material, and the top of the heavily-doped semiconductor material protrudes out of the inner dielectric layer; and
    applying a thermal oxidation process to oxidize the top of the heavily-doped semiconductor material to form the inter-electrode dielectric layer and the shielding electrode;
    wherein the step of forming the trench gate structure further includes: forming the gate electrode at the upper portion of the trench.

3. The manufacturing method of a trench power semiconductor device according to claim 2, further comprising:
    before forming the trench, forming a hard film layer on the protective layer.

4. The manufacturing method of a trench power semiconductor device according to claim 3, wherein the hard film layer on the surface of the epitaxial layer is removed after the forming of the inter-electrode dielectric layer.

5. The manufacturing method of a trench power semiconductor device according to claim 3, wherein in the step of forming the trench, an opening, in connection with the trench, is formed in the hard film layer and the protective layer.

6. The manufacturing method of a trench power semiconductor device according to claim 5, wherein the step of forming the initial spacing layer includes:
    forming a spacing dielectric layer, wherein the spacing dielectric layer covers the surface of the hard film layer, the inner surface of the opening, the two sidewall portions and the bottom of the insulating layer, and the material for the spacing dielectric layer is the same as the material for the protective layer; and removing the spacing dielectric layer covering the bottom and the surface of the hard film layer to form the initial spacing layer, wherein the extending portions of the first sidewall portion and the second sidewall portion cover the inner surface of the opening.

7. The manufacturing method of a trench power semiconductor device according to claim 6, wherein the spacing dielectric layer and the protective layer are nitride layers, and the insulating layer and the inner dielectric layer are oxide layers.

8. The manufacturing method of a trench power semiconductor device according to claim 2, wherein the step of forming the trench gate structure incudes:
before forming the gate on the upper portion of the trench, removing the extending portion and the initial spacing layer at the upper portion of the trench to form a spacing layer, wherein the spacing layer is located below the gate and includes a first spacing portion and a second spacing portion respectively at the two opposite sides of the shielding electrode.

9. The manufacturing method of a trench power semiconductor device according to claim 8, wherein in the step of removing the extending portion and the initial spacing layer at the upper portion of the trench, the protective layer is also removed.

10. The manufacturing method of a trench power semiconductor device according to claim 2, wherein the step of forming the trench gate structure incudes:
after forming the gate at the upper portion of the trench, removing the extending portion that extends out from the surface of the epitaxial layer to form a spacing layer, wherein the spacing layer includes a first spacing portion and a second spacing portion, and the first spacing portion and the second spacing portion are at the outer side of the gate and function as a gate insulating layer.

11. The manufacturing method of a trench power semiconductor device according to claim 10, wherein in the step of removing the extending portion, the protective layer is also removed.

12. The manufacturing method of a trench power semiconductor device according to claim 1, further comprising:
forming a substrate area and a source area in the epitaxial layer.

13. The manufacturing method of a trench power semiconductor device according to claim 12, further comprising:
forming a wire redistribution layer on the surface of the epitaxial layer, wherein the wire redistribution layer includes an interlayer dielectric layer on the epitaxial layer, a source conductive layer on the interlayer dielectric layer, and at least one conductive pillar penetrates the interlayer dielectric layer, and the source metal layer electrically connects with the source area through the conductive pillar.

14. A manufacturing method of a trench power semiconductor device, comprising:
forming an epitaxial layer on a substrate;
forming a protective layer on a surface of the epitaxial layer;
forming a trench in the epitaxial layer; and
forming a trench gate structure in the trench, wherein the trench gate structure includes a shielding electrode, a gate disposed on the shielding electrode and an inter-electrode dielectric layer disposed between the shielding electrode and the gate, and the step of forming the trench gate structure at least includes:
forming an insulating layer covering an inner surface of the trench;
before the step of forming the inter-electrode dielectric layer, forming an initial spacing layer, wherein the initial spacing layer includes a first sidewall portion and a second sidewall portion respectively covering the two inner surfaces of the insulating layer, the bottom end portion of the first sidewall portion is separate from the bottom end portion of the second sidewall portion, and both of the first and second sidewall portions have an extending portion protruding from the protective layer;
forming an initial inner dielectric layer covering the initial spacing layer, wherein the bottom of the initial inner dielectric layer is directly in contact with the bottom of the insulating layer;
forming a heavily-doped semiconductor material at the lower portion of the trench;
removing the initial inner dielectric layer at the upper portion of the trench to form an inner dielectric layer at the low portion of the trench, wherein the inner dielectric layer surrounds the heavily-doped semiconductor material, and the top of the heavily-doped semiconductor material protrudes out of the inner dielectric layer;
applying a thermal oxidation process to oxidize the top of the heavily-doped semiconductor material to form the inter-electrode dielectric layer and the shielding electrode; and
forming the gate electrode at the upper portion of the trench.

* * * * *